United States Patent
Gunturi et al.

(10) Patent No.: US 11,641,216 B2
(45) Date of Patent: *May 2, 2023

(54) RELIABILITY HANDLING FOR WIRELESS TRANSCEIVERS

(71) Applicant: TEXAS INSTRUMENTS INCORPORATED, Dallas, TX (US)

(72) Inventors: Sarma Sundareswara Gunturi, Bengaluru (IN); Jagannathan Venkataraman, Bengaluru (IN); Jawaharlal Tangudu, Bengaluru (IN); Narasimhan Rajagopal, Chennai (IN); Eeshan Miglani, Chhindwara (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/689,627

(22) Filed: Mar. 8, 2022

(65) Prior Publication Data

US 2022/0190856 A1 Jun. 16, 2022

Related U.S. Application Data

(63) Continuation of application No. 17/112,137, filed on Dec. 4, 2020, now Pat. No. 11,303,312.

(30) Foreign Application Priority Data

Dec. 5, 2019 (IN) .............................. 201941050156

(51) Int. Cl.
*H04B 1/10* (2006.01)
*H04B 1/40* (2015.01)
(Continued)

(52) U.S. Cl.
CPC ......... *H04B 1/1018* (2013.01); *H03G 3/3036* (2013.01); *H04B 1/123* (2013.01);
(Continued)

(58) Field of Classification Search
CPC ....... H03G 2201/103; H03G 2201/106; H03G 2201/206; H03G 2201/307; H03G 3/3036;
(Continued)

(56) References Cited

U.S. PATENT DOCUMENTS

8,614,603 B1 12/2013 Wyse et al.
10,523,251 B1 * 12/2019 Coban .................. H04B 17/318
(Continued)

*Primary Examiner* — Nguyen T Vo
(74) *Attorney, Agent, or Firm* — John R. Pessetto; Frank D. Cimino (57) ABSTRACT

Techniques maintaining receiver reliability, including determining a present attenuation level for an attenuator, wherein the attenuation level is set by a gain controller, determining a relative reliability threshold based on the present attenuation level, receiving a radio frequency (RF) signal, determining a voltage level of the received RF signal, comparing the voltage level of the received RF signal to the relative reliability threshold to determine that a reliability condition exists, and overriding, in response to the determination that the reliability condition exists, the present attenuation level set by the gain controller with an override attenuation level based on the present attenuation level.

16 Claims, 5 Drawing Sheets

(51) Int. Cl.
*H03G 3/30* (2006.01)
*H04B 1/12* (2006.01)

(52) U.S. Cl.
CPC ......... *H04B 1/40* (2013.01); *H03G 2201/103* (2013.01); *H03G 2201/307* (2013.01)

(58) Field of Classification Search
CPC .. H03G 3/3052; H03G 3/3078; H04B 1/1018; H04B 1/123; H04B 1/16; H04B 1/40
See application file for complete search history.

(56) References Cited

U.S. PATENT DOCUMENTS

| | | |
|---|---|---|
| 11,303,312 B2 * | 4/2022 | Gunturi .................... H04B 1/16 |
| 2007/0082639 A1 | 4/2007 | Lindstrom et al. |
| 2012/0329415 A1 | 12/2012 | Ruijter |
| 2018/0351592 A1 | 12/2018 | Coban |

* cited by examiner

RELIABILITY HANDLING FOR WIRELESS TRANSCEIVERS

CROSS-REFERENCE TO RELATED APPLICATIONS

This application is a Continuation of U.S. patent application Ser. No. 17/112,137, filed Dec. 4, 2020, which claims priority to India Provisional Application No. 201941050156, filed Dec. 5, 2019, entitled, "RX/FB Relative Reliability Handling in Wireless Transceivers", which are hereby incorporated by reference.

BACKGROUND

Wireless systems usually include wireless transceivers used to transmit and receive wireless signals. Often these transceivers need to be able to support a relatively wide dynamic range of received signal power, for example with a power level of −60 dBm to 20 dBm. To help support wide dynamic ranges, these transceivers often include low noise amplifiers (LNAs) which provide amplification to the received signals. Generally, gain refers to a ratio between output voltage and input voltage. These LNAs often include a gain setting that may be adjusted by an automatic gain controller (AGC), which can be used to help prevent damaging components of the transceivers, such as a digital step attenuator (DSA), by reducing the gain when a relatively high-voltage signal is received. For example, to receive a high voltage signal, the gain of an LNA and/or an adjustable gain of the DSA may be adjusted by the AGC. However, certain relatively high-voltage signals may be a concern. When a relatively high gain setting is used to help receive a relatively low voltage signal and a relatively high-voltage signal, such as from a very close transmitter, is received, the AGC may not be able to adjust the DSA gain quickly enough and the DSA may be damaged. Additionally, high voltage levels over some relatively long periods of time can cause transceivers to be saturated, resulting in potential reliability issues.

SUMMARY

This disclosure relates to a technique related to maintaining receiver reliability, including determining a present attenuation level for an attenuator, wherein the attenuation level is set by a gain controller. The technique further includes determining a relative reliability threshold based on the present attenuation level, receiving a radio frequency (RF) signal, and determining a voltage level of the received RF signal. The technique further includes comparing the voltage level of the received RF signal to the relative reliability threshold to determine that a reliability condition exists. The technique further includes overriding, in response to the determination that the reliability condition exists, the present attenuation level set by the gain controller with an override attenuation level based on the present attenuation level.

Another aspect of the present disclosure relates to a receiver comprising a gain controller configured to set a present attenuation level for an attenuator. The receiver may also include a reliability detector module configured to determine a relative reliability threshold based on the present attenuation level. The receiver may also include a detector configured to receive a radio frequency (RF) signal, and determine a voltage level of the received RF signal. The receiver may also include an override value module configured to: compare the voltage level of the received RF signal to the relative reliability threshold to determine that a reliability condition exists, and override, in response to the determination that the reliability condition exists, the present attenuation level set by the gain controller with an override attenuation level based on the present attenuation level.

Another aspect of the present disclosure relates to an electronic device comprising one or more processors, a memory, and a reliability detector module configured to determine a relative reliability threshold based on a present attenuation level. The electronic device may also include a detector configured to: receive a radio frequency (RF) signal and determine a voltage level of the received RF signal. The electronic device may also include an override value module configured to: compare the voltage level of the received RF signal to the relative reliability threshold to determine that a reliability condition exists and override, in response to the determination that the reliability condition exists, the present attenuation level set by the gain controller with an override attenuation level based on the present attenuation level.

BRIEF DESCRIPTION OF THE DRAWINGS

For a detailed description of various examples, reference will now be made to the accompanying drawings in which.

DETAILED DESCRIPTION

Wireless receivers, such as those used for wireless base stations, evolved Node B's, access points, mobile devices, etc., often need to support a wide dynamic range of received, or input, signal voltage levels. Components of the receivers, such as a DSA, are quite sensitive and can be degraded by too high an input voltage level. To help prevent this, and also to enhance the supported dynamic range, receivers may include components with an adjustable gain that may be controlled by an adjustable gain controller (AGC). It may be understood that transceivers include components for receiving and sending wireless signals and as the concepts discussed herein with respect to receivers apply to transceivers as well. The AGC may assert a signal to the LNA and/or the DSA to reduce the gain, or even attenuate, the voltage of the input signal based on the input voltage level to reduce the voltage of an output of the DSA, which is then passed on to a radio frequency analog to digital converter (RF-ADC). Attenuation generally refers to a gain setting of less than 1, which thereby results in a voltage level of the output signal that is smaller than the voltage level of the input signal.

Figure 1:
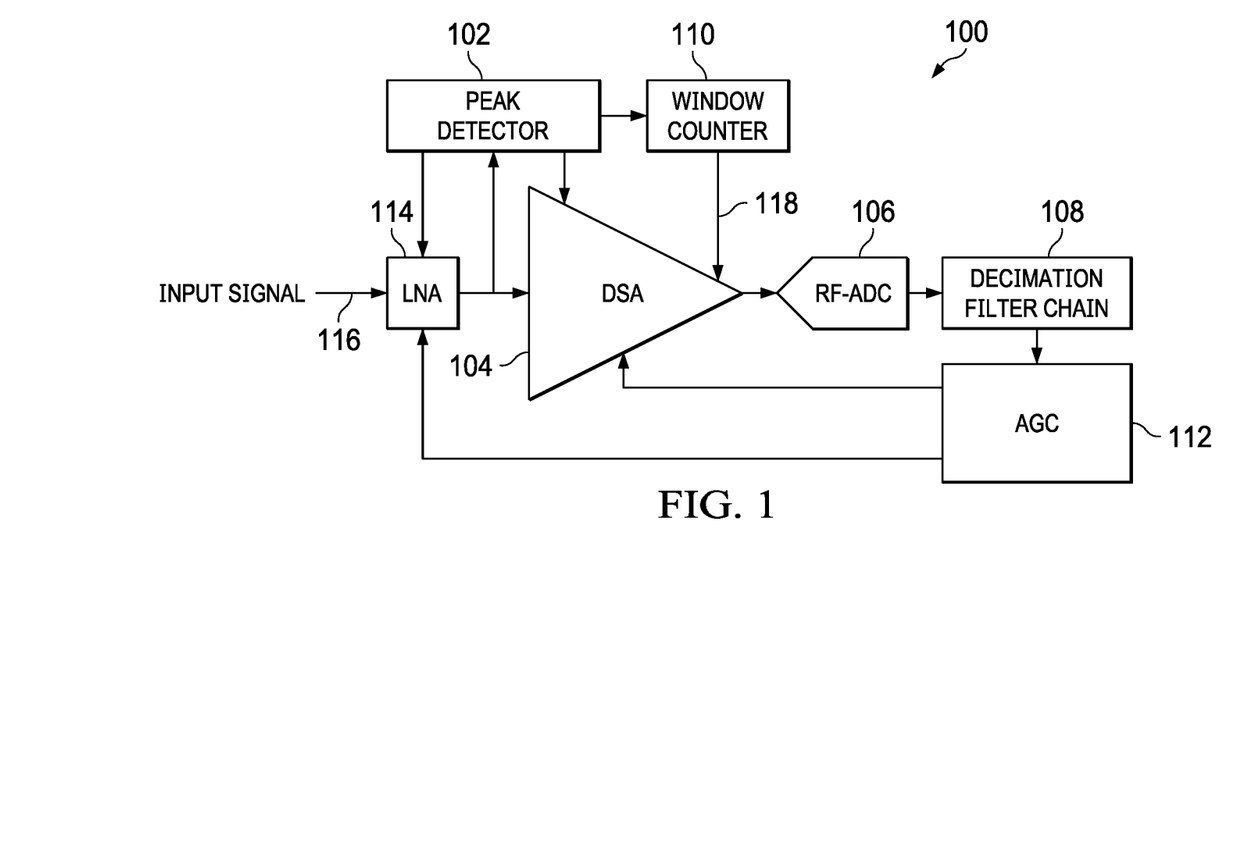
FIG. 1 illustrates an example circuit for absolute reliability handling in wireless receivers.

As an example, FIG. 1 illustrates an example circuit 100 for absolute reliability handling in wireless receivers. In some cases, absolute reliability may refer to a condition where a received signal voltage level of an input signal is above a threshold maximum voltage level. For example, if a device, such as a DSA, may be damaged, and become less sensitive to input, by signal voltages above a certain voltage level over a period of time and it is desirable to minimize the cumulative amount of time the device is exposed to those signal voltages above a certain voltage level. The circuit 100 illustrates an RF sampling receiver including an LNA 114, peak detector 102, window counter 110, DSA 104, RF-ADC 106, decimation filter chain 108 and AGC 112. The LNA 114 is coupled to a peak detector 102 and DSA 104. The peak detector 102 is in turn coupled to a window counter 110 and the DSA 104. The DSA is coupled to a RF-ADC 106. The RF-ADC 106 is coupled to an AGC 112. The AGC 112 is coupled to the DSA 104 and LNA 114. It may be understood that while FIG. 1 illustrates an RF sampling receiver, the techniques discussed herein are also applicable to other RF receiver designs, such as direct conversion (e.g., zero intermediate frequency) receivers. The circuit 100 includes a peak detector 102, but other types of detectors can be used, such as a root mean square power detector. The peak detector 102 is configured to detect the peak voltage level of an input signal 116. In this example, the peak detector 102 is also configured to detect an absolute reliability condition where a received signal voltage level of the input signal 116 is above a threshold maximum voltage level.

In some cases, a level of attenuation of an LNA 114 and/or the DSA 104 may be controlled, for example, by an AGC 112 which may be downstream of a RF-ADC 106 and a decimation filter chain 108. In some cases, the DSA 104 may include multiple gain modes, such as a high-gain mode or a low-gain mode, and each gain mode may provide varying amounts of gain adjustability. For example, different gain modes may have different ranges of gain settings and some gain modes may have a wider range of supported gain settings than other gain modes. The AGC 112 may be internal to the receiver circuit, or external to the receiver circuit. Similarly, the LNA 114 may be internal or external to the receiver circuit. Adjusting the gain of the DSA 104 with the downstream AGC 112 may not be sufficient to prevent reliability issues of the DSA due to an amount of time that may be needed for the AGC to detect and respond to the absolute reliability condition. Thus, overriding the gain setting of the AGC may be desired. For example, where an input signal 116 is received with a received signal voltage level above a predetermined absolute threshold maximum level, such as voltage corresponding to 12 dBm, the peak detector 102 may determine that an absolute reliability condition exists and override the present attenuation level of a DSA 104 set, for example, by the AGC. When overriding the present DSA setting, the peak detector 102 may, for example, set the DSA 104 attenuation level to a maximum attenuation level or some other predetermined attenuation level based on the received signal voltage level.

In some cases, a signal with a voltage level below the predetermined absolute threshold maximum voltage level but sustained for a substantial period of time may also saturate the DSA and cause relative reliability issues. As an example, a DSA, at a certain setting may be damaged by an input signal voltage that is lower than the voltage of the absolute reliability threshold, if that input signal voltage is sustained over some period of time. While a signal voltage may be below the absolute reliability threshold, the signal voltage may be higher than a saturation level of the DSA at some gain settings of the DSA. For example, for some gain settings of the DSA there is a voltage level such that an input signal beyond the voltage level will saturate the DSA. If the input signal voltage is higher than this voltage level is sustained for a period of time, the DSA may be damaged. To help address such issues, a peak detector 102 may be used to detect voltage peaks within an RF frame that may cause reliability issues. For example, the peak detector 102 may sample input level at a particular frequency and at each sample instance, the peak detector 102 may output an indication (e.g., a logic high (1) if the sampled voltage is above a threshold voltage level configured for the peak detector 102 and a logic low (0) if the sampled voltage is below the threshold voltage level configured for the peak detector 102) whether the sampled voltage is above a threshold voltage level. In certain cases, the peak detector 102 voltage level threshold level maybe configured based on, for example, the DSA attenuation level.

Window counter 110 is incremented responsive to each instance of a 1 from the peak detector 102. If the window counter 110 exceeds a predetermined hit threshold a reliability condition may be asserted. In response to detection of the reliability condition (i.e., window counter's count value exceeding the predetermined hit threshold), the window counter 110 asserts a signal 118 to the DSA 104 to cause the attenuation setting for the DSA 104 to be overridden to a new attenuation setting. In some cases, the threshold voltage level of the peak detector 102 and/or the hit threshold of the window counter may be configurable. For example, the hit threshold of the window counter may be a programmable value in a register that can be set by an external master, such as a micro-controller, serial peripheral interface, etc. The value of the hit threshold may be determined, for example, based on circuit design, testing, manufacturing, etc. As another example, the hit threshold of the window counter may be a predetermined value set as a part of circuit design, testing, manufacturing, etc.

In some cases, after one or more RF frames are received with a voltage level below the threshold voltage level, the window counter 110 reliability condition may be reset. After a reliability condition is detected, a different voltage level threshold and window counter 110 may be set. For example, the voltage level threshold may be reduced once the initial voltage level threshold is hit. In some cases, the window counter 110 may count to a release length number and accumulate a number of sample instances received with a voltage level above the threshold voltage level. After the release length number is reached, the accumulated number is compared to a release threshold number. If the release condition window counter is below the release threshold number, then the reliability condition may be released (e.g., reset).

As transistor sizes shrink, the voltage rating of transistors is also reduced. This reduced voltage capacity can raise issues with relative reliability, in addition to the absolute reliability issues discussed above. Relative reliability is related to the voltage of a received signal as compared to a full scale (FS) signal. For digital systems, there is a defined maximum digital signal peak amplitude, or voltage, level, defined as 0 dBFS. This full-scale signal can vary based on a level of DSA attenuation being applied. Generally, a signal above 0 dBFS will saturate a receiver, but a signal above 0 dBFS but below a predetermined absolute reliability threshold may not raise a reliability issue. In some cases, voltage levels for a received signal above a full-scale voltage level, but below the predetermined absolute reliability threshold, may cause relative reliability issues. For example, for a DSA setting of 0 dB, a full-scale signal may be −1 dBm. If, however, an 8 dBm signal is received, this signal is +9 dB higher than the full-scale signal or 0 dBFS voltage level supported by the DSA setting. This 8 dBm input signal is +9 dB signal relative to the full-scale signal 0 dBFS for the given DSA setting. This signal voltage level, while still below, for example, a 12 dBm predetermined absolute threshold maximum voltage level, may still cause reliability issues for the receiver. In accordance with aspects of the present disclosure, a reliability threshold may be determined based on a DSA attenuation setting in addition to, or instead of, the predetermined absolute threshold maximum voltage level.

Figure 2A:
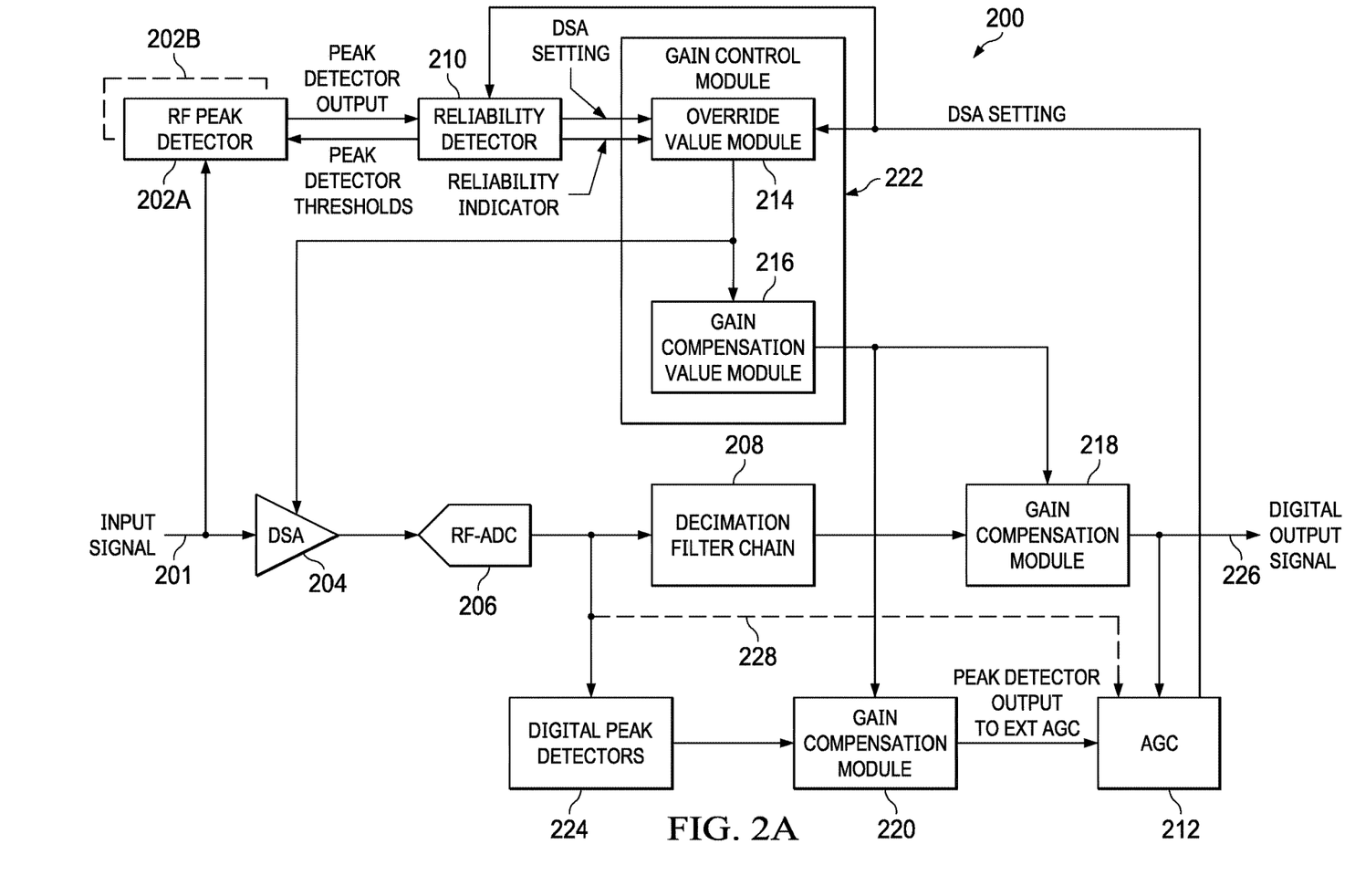
FIGS. 2A and 2B illustrates an example circuits for relative reliability handling, in accordance with aspects of the present disclosure.

FIG. 2A illustrates an example circuit 200 for relative reliability handling, in accordance with aspects of the present disclosure. Circuit 200 includes an input signal 201 input to a DSA 204 and an RF peak detector 202A. An output of the DSA 204 is coupled to an input of RF-ADC 206. An output of the RF-ADC 206 is coupled to an input of a decimation filter chain 208 and input of digital peak detectors 224. An output of the decimation filter chain 208 is coupled to an input of gain compensation module 218, which, in turn, outputs to an AGC 212 and another circuit. An output of the digital peak detectors 224 is coupled to an input of a gain compensation module 220. An output of the gain compensation module 220 is coupled to an input of the AGC 212. An output of AGC 212 is coupled to an input of an override value module 214 of a gain controller module 222. Another output of AGC 212 is coupled to an input of a reliability detector 210. An output of the override value module 214 is coupled to an input of a gain compensation value module 216 of the gain controller module 222. An output of the gain compensation value module 216 is coupled to an input of the gain compensation module 218 and an input of the gain compensation module 220. An output of the override value module 214 is also coupled to an input of the DSA 204. The RF peak detector 202A is communicatively coupled to reliability detector 210 and an output of the RF peak detector 202A may be coupled to an input of the reliability detector 210. An output of the reliability detector 210 may pass peak detector thresholds to an input of the RF peak detector 202A. An output of reliability detector 210 is coupled to an input of override value module 214 and the reliability detector 210 may output a reliability indicator and a DSA setting to the override value module 214. In certain cases, the reliability indicator may be set to high to indicate that the DSA setting from the reliability detector 210 should be used to override the DSA setting from the AGC 212.

As shown, circuit 200 includes an RF peak detector 202A for detecting the peak signal voltage level of the input signal 201, a DSA 204, a RF ADC 206, and a decimation filter chain 208. The DSA 204 is configured to provide an adjustable amount of attenuation for the input signal 201 based on a reliability detector 210 and an AGC 212 in conjunction with the gain controller module 222. The gain controller module 222 may receive gain information from the AGC 212 as well as information from the reliability detector 210 to determine whether the gain should be overridden. In this example, the gain controller module 222 includes an override value module 214 for determining a gain override value and a gain compensation value module 216 to determine a gain compensation value. In some cases, the AGC 212 may be integrated along with other components of circuit 200. In some cases, the AGC 212 may be coupled to, but external to components of circuit 200, such as a part of a separate application specific integrated circuit (ASIC). In non-override operation, an attenuation setting of the DSA 204 is directly controlled by the AGC 212. While the attenuation setting may be in any form or unit, for clarity DSA settings are discussed in terms of decibels, where decibels are 20×log 10(gain), where gain is in a linear scale. Gain may be equal to the output/input voltage in milliwatts. In this example embodiment, the AGC 212 receives a digital signal, as converted from an analog signal to a digital signal by the RF-ADC 206. The AGC 212 determines a DSA setting for the DSA 204. For example, in a case where a relatively low voltage input signal is received, the AGC 212 may determine a threshold voltage which may saturate the DSA 204 and determine that the relatively low voltage signal is far from saturating the DSA 204. Based on the saturation measurement, the AGC 212 may determine an attenuation setting for the DSA 204. For example, the AGC 212 may utilize a lookup table, adjusting attenuation settings when the received signal is detected above the threshold voltage and continuing to adjust the attenuation signals if additional received signals are still above the threshold voltage. In certain cases, the AGC may increase the gain until the resulting voltage crosses a first target threshold voltage and reduce the gain until the resulting voltage crosses above a second target threshold voltage. In this manner, the AGC may increase and/or decrease the DSA attenuation setting (e.g., DSA gain) to maintain the signal voltage between the first and second target thresholds, helping to maximize a signal to noise ratio. In this example, the AGC 212 may determine that the attenuation setting may be reduced to effectively increase the gain applied to the input signal 201. The AGC 212 sends the DSA setting information to the DSA 204 via the gain controller module 222 and the reliability detector 210 obtains the DSA setting information. In some cases, the DSA setting information may include a value from the AGC adjusting the DSA gain.

Figure 2B:
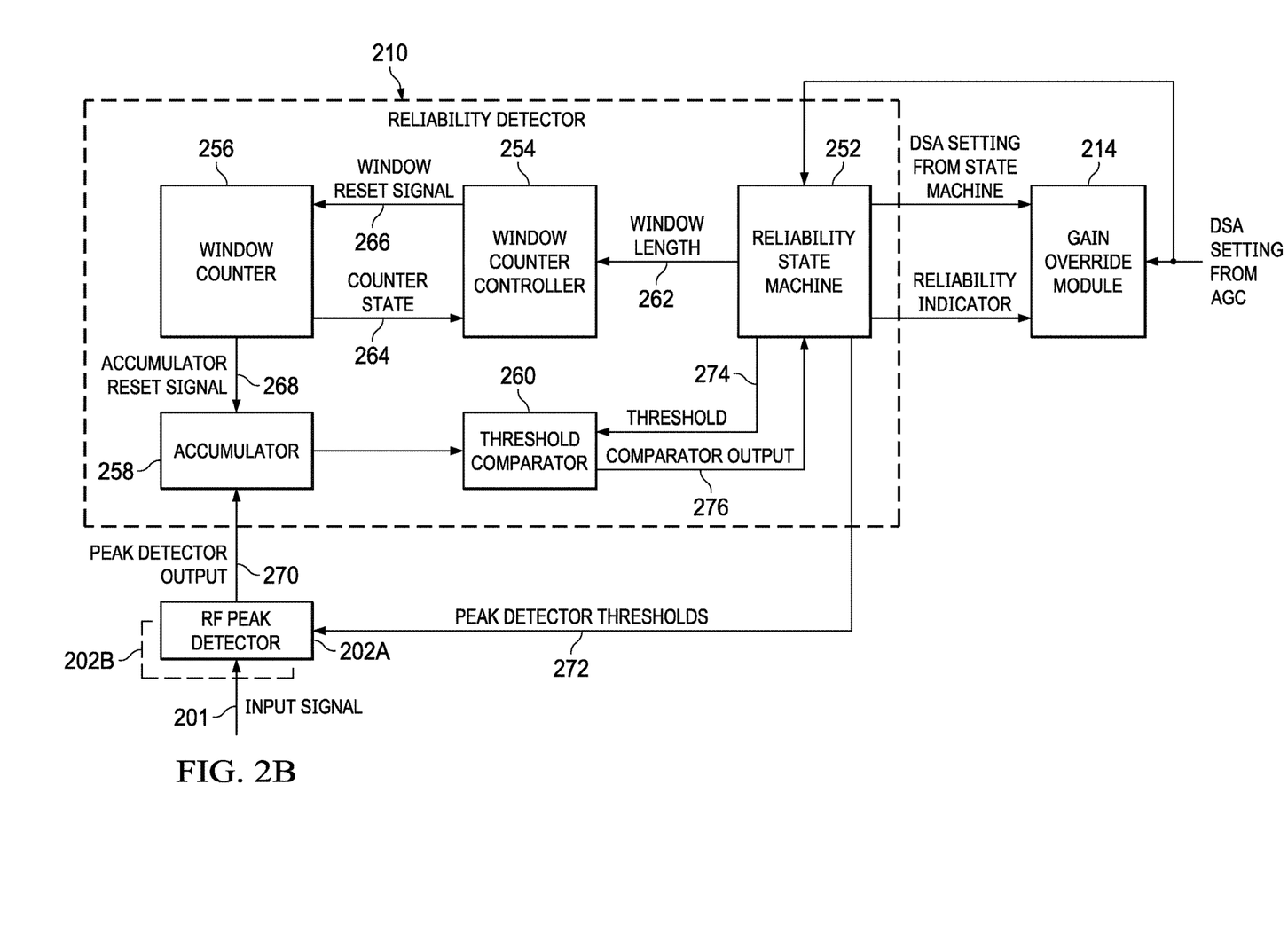

In some cases, the AGC 212 may determine the DSA setting based on the input signal 201 signal. However, if a reliability condition, either absolute or relative, is detected, the reliability detector 210 may determine a different DSA setting. FIG. 2B illustrates an example circuit for a reliability detector 210, in accordance with aspects of the present disclosure. The reliability detector 210 may include a reliability state machine 252 for detecting and responding to reliability conditions. The reliability state machine may be coupled to an output of the AGC (not shown) and receive DSA setting information input from the AGC. The reliability state machine 252 may also be coupled to and output to a window counter controller 254. The window counter controller 254 may be communicatively coupled to a window counter 256, which may output to an accumulator 258. The accumulator 258 may also accept input from the RF peak detector 202A and output to a threshold comparator 260. The threshold comparator 260 may be communicatively coupled to the reliability state machine 252. The reliability state machine 252 may output to the gain override module 214.

The reliability state machine 252 may output to the window counter controller 254, a signal indicating a window length 262 (e.g., period of time of the window). This window length 262 may indicate a period of time to wait before resetting a window counter if an input signal beyond the threshold voltage level is not received within the period of time. This window length 262 may be adjusted, for example, if an input signal beyond the threshold voltage is received. The window counter controller 254 may receive a counter state indication 264 from the window counter 256 indicating whether the window counter 256 is running to track a reliability condition. The window counter controller 254 may also assert a window reset signal 266 to the window counter 256 when the period of time has passed. The window counter 256 may assert an accumulator reset signal 268 to the accumulator 258 when the window counter is being reset. The RF peak detector 202A may regularly determine the input signal voltage level and output 270, for example, a value, such as 1, indicating whether the input signal voltage level is above a peak detector threshold or another value, such as 0, indicating that the input signal voltage is below the peak detector threshold. The accumulator 258 counts a number of times the input signal voltage level is above the peak detector threshold and outputs this number to the threshold comparator 260. The reliability state machine 252 may also output to the RF peak detector 202A and set the peak detector thresholds 272. The threshold comparator 260 determines whether the reliability condition is still present by monitoring the output of the accumulator 258 for changes to the number of times the input signal voltage level is above the peak detector threshold within a number of hits threshold 274 received from the reliability state machine 252. The threshold comparator 260 may output 276 to the reliability state machine 252 indicating whether the reliability condition is present. Based on output 276, the reliability state machine 252 may determine if the reliability condition is present or not.

Returning to FIG. 2A, based on the DSA setting information, the reliability detector 210 determines a relative reliability threshold. In some cases, the relative reliability thresholds may differ for some or each of the DSA settings. As an example, the relative reliability threshold may be configured to be 9 dB higher than the voltage level of 0 dBFS of the present DSA gain. Thus, as a more specific example, where the present DSA setting is 0 dB the 0 dBFS voltage level, which, in this example, corresponds to −1 dBm, the relative reliability threshold, if configured to be 9 dB higher than the voltage level of 0 dBFS, at the present DSA setting of 0 dB would correspond to 8 dBm. In some cases, the relative reliability thresholds for the DSA settings may be configurable or programmable, or based on a particular hardware configuration, such as the external AGC type, RF-ADC type, DSA type, or bands being received. For example, a set of registers or a lookup table may be provided to store the relative reliability thresholds and these registers may be externally accessible to allow the relatively reliability thresholds to be adjusted. The relative reliability thresholds may be, in some cases, predetermined and stored in a memory.

Once a relative reliability threshold is determined for a present DSA setting, a voltage level for a received signal, as determined by the peak detector 202A, is compared to the relative reliability threshold. In some cases, the peak detector 202A may be configured to regularly determine the input signal voltage level, such as 128 or 256 times per second, and output this signal voltage level information to the reliability detector 210. For example, the peak detector can regularly output a binary signal with a value indicating whether the input signal voltage level is above or below the relative reliability threshold. The reliability detector 210 may receive the signal voltage level information and count a number of instances in which the signal voltage level exceeds the relative reliability threshold for a given time period. If the number of instances exceeds a number of peaks (e.g., number of instances where the signal voltage level exceeds the relatively reliability threshold) threshold, the reliability detector 210 may determine that the received signal has exceeded the relative reliability threshold and that a relative reliability condition exists. In some cases, the number of peaks threshold may be configurable, for example by a user. For example, one or more registers may be provided to store the number of peaks threshold and these registers may be externally accessible to allow the a number of peaks thresholds to be adjusted.

Returning to the earlier example where the relatively low voltage signal is being received, another transmitter may start to transmit a relatively high-voltage signal to the receiver. This relatively high-voltage signal may be received and the voltage level for the received signal may be determined to exceed the relative reliability threshold based on, for example, twenty instances over a course of 128 measurements of the peak detector to be 9 dB, higher than the 0 dBFS voltage level, at the present DSA setting of 0 dB, of −1 dBm.

If the voltage of a received signal exceeds the relative reliability threshold, an override value module 214 may determine a gain override value. In some cases, this gain override value may be based on the present DSA setting and/or as an offset value from the present DSA setting. In some cases, the gain override value may be based on the relative reliability threshold. For example, the gain override value may be determined based on a difference between the relative reliability threshold for the present DSA setting and the voltage level for the received signal. Returning to the previous example, as the received signal has a voltage level of 9 dBm and the relative reliability threshold is 8 dBm, the gain override value may be determined to be 1 dB. In other cases, the gain override value may be configurable. As a second example, if an incoming signal voltage level is 9 dBm and the relative reliability threshold is 8 dBm for a 0 dB DSA setting, the override gain value may be determined to be 9 dB. Once the gain override value is determined, the present DSA setting is overridden based on the gain override value. Returning to the previous example, the present DSA setting of 0 dB may then be overridden and set to an overridden DSA setting of 1 dB. In the second example, the present DSA setting of 0 dB may be overridden and set to the overridden DSA setting of 9 dB.

Overriding the AGC 212 settings for the DSA 204 could, in some cases, result in undesirable feedback loops. For example, if the present DSA setting is overridden to increase the DSA settings, attenuation is increased, which effectively reduces the gain of received input signals and saturation of the DSA 204. If the AGC 212 detects that saturation has decreased, the AGC 212 may attempt to lower the DSA setting, thereby increasing the amplitude of the signal provided to the RF-DAC 206. Gain compensation may be used to help address such potential feedback loops. A gain compensation value module 216 determines a gain compensation value. In some cases, the gain compensation value may be based on the gain override value determined by the override value module 214. The gain compensation value module 216 may, in some cases, be combined with the override value module 214. In some cases, the AGC 212 may be coupled downstream of the decimation filter chain 208. In such cases, a gain compensation module 218, coupled between the decimation filter chain 208 and the AGC 212, may apply gain compensation to a digital signal input to the gain compensation module 218, effectively increasing a gain of an output digital signal 226. In some cases, the AGC 212 may be coupled 228 upstream of the decimation filter chain 208 to directly sample a digital version of the received analog signal. In some cases, the gain compensation module 220 may be configured to support a higher bandwidth, such as 2-3 GHz, as compared to gain compensation module 218 as the gain compensation module 220 is sampling data prior to the decimation filter chain 208.

In some cases, the AGC 212 may receive the gain compensated output of the gain compensation modules 218, 220 and use the output to help the AGC 212 to effectively see that the RF-ADC 206 is saturating. The AGC 212 may then help adjust the DSA setting appropriately, such as by increasing the DSA attenuation setting. In some cases, the AGC 212 may be an external AGC. As an example of an external AGC, the AGC may be integrated as a part of a separate circuit or chip from the RF-ADC 206, DSA 204, and decimation filter chain 208. The external AGC, in such cases, is communicatively coupled to the gain controller module 222.

Figure 3:
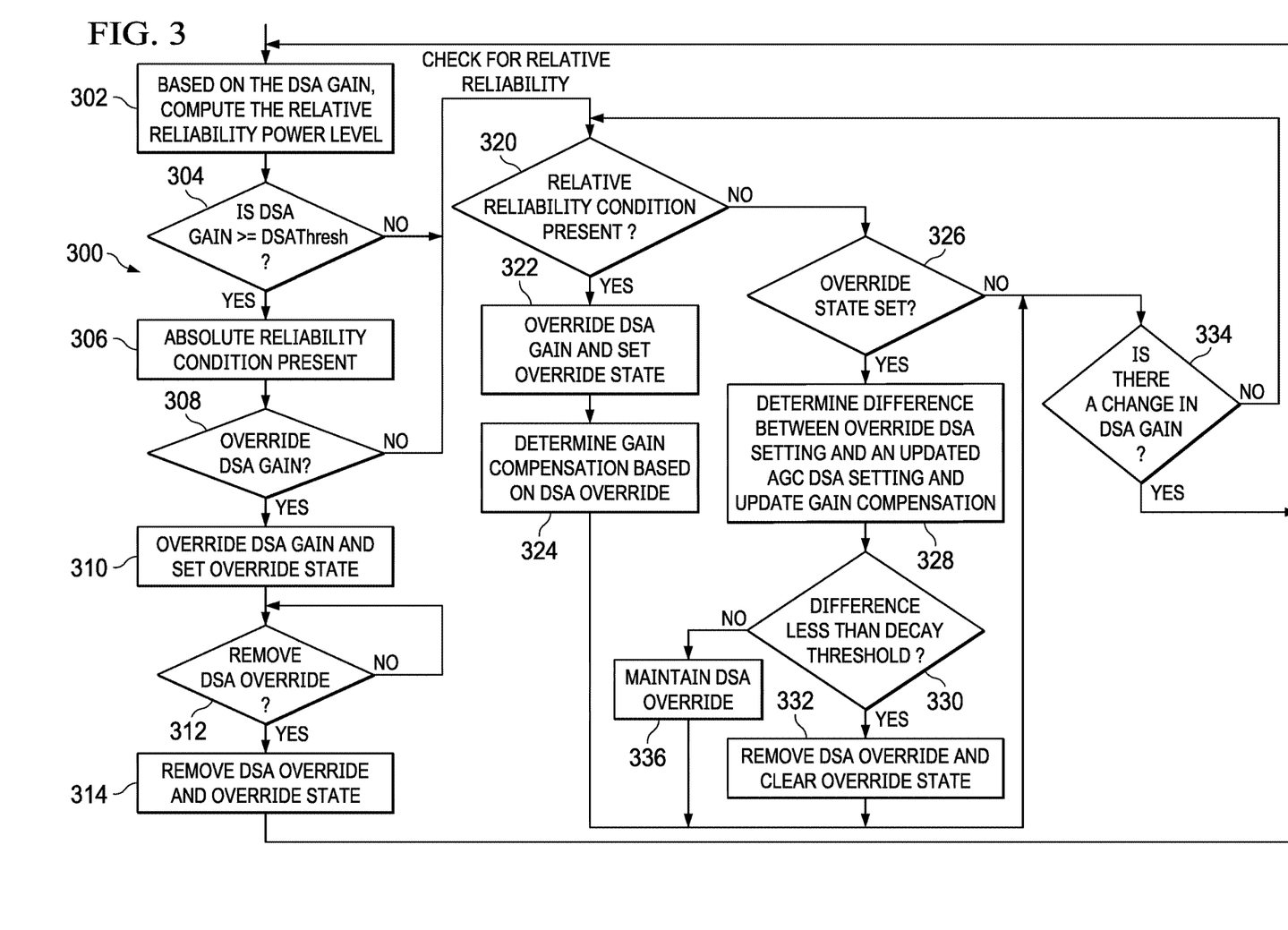
FIG. 3 is a flowchart for reliability handling, in accordance with aspects of the present disclosure.

FIG. 3 is a flow chart 300 for reliability handling, in accordance with aspects of the present disclosure. In this example embodiment, the flow chart 300 illustrates a technique for detecting absolute and relative reliability conditions. In some cases, the reliability state machine 252 of FIG. 2B may implement the techniques shown in flow chart 300. Where a receiver is configured to detect both absolute and relative reliability conditions, the reliability condition being checked may be determined, in some cases, by the DSA setting. For a particular DSA setting, at block 302, a relative reliability threshold is determined, for example by reliability detector 210 as discussed above. In some cases, this threshold may be used to determine settings for the analog RF peak detector. At decision block 304, a determination is made, for example by reliability detector 210, as to which threshold voltage level to use. Which threshold voltage level to use can be expressed as a function min(voltage level at 0 dBFS (or present DSA setting)+relative reliability threshold, absolute reliability threshold). Thus, the function finds the minimum of either a voltage level at 0 dBFS plus the relative reliability threshold or the absolute reliability. This expression may be evaluated by the peak detector 202A, or the state machine 252 of FIG. 2B, to detect a relative reliability condition below a particular DSA attenuation setting. Above the particular DSA attenuation setting, detecting an absolute reliability condition is given a higher preference. As an example, assume for a particular receiver if the 0 dBFS voltage level with 0 dB DSA setting is 0 dBm and an absolute reliability attenuation level setting at 20 dBm. For the 12 dB DSA, the 0 dBFS voltage level would be 0+12=12 dBm. If the relative reliability threshold is 9 dB, the relative reliability voltage level would be 12+9=21 dBm. However, if, as in this example, there is an absolute reliability voltage threshold at 20 dBm, the 12 dB DSA gain setting would exceed the absolute reliability voltage threshold. In some cases, the determination of block 304 may be included in state 302. Thus, a determination may be made that at a DSA attenuation setting of 11 dB or higher, the input voltage level may be checked for the absolute reliability condition, for example, by a peak detector, at block 306 and below the DSA attenuation setting of 11 dBm, the input voltage level may be checked for the relative reliability condition at state 320, for example, by another peak detector.

As a more specific example where the input voltage level is checked for relative reliability, assume that the particular receiver embodiment discussed in the previous example with a DSA attenuation setting of 0 dBFS receives an input signal with a voltage level of 10 dBm. As this input signal voltage is above the relative reliability threshold of 9 dBm, the relative reliability condition is detected at decision block 320 in a manner as discussed above with respect to the reliability detector 210. In this example, at block 322, the DSA setting is overridden based on the determined gain override value offset corresponding to a DSA setting of 9 dB. In some cases, an override state indicator, such as a flag, register entry, or bit, is set indicating that the DSA setting has been overridden. At block 324, a corresponding gain compensation value may be determined based on the DSA override setting, for example as an offset value. As there was a change in the DSA settings, control returns, via decision block 334, to block 302. As the 9 dB DSA setting is still below 11 dB, input voltage continues to be checked for relative reliability condition at decision block 320 with a second relative reliability threshold. As the DSA settings were changed in a first round of overriding the DSA setting, the relative reliability threshold (e.g., the second relative reliability threshold) is determined again at block 302. Assuming the second relative reliability threshold is also 9 dB above 0 dBFS at a 9 dB DSA attenuation setting, the second relative reliability threshold is determined to be 18 dBm. Assuming the received signal voltage continues to be measured at 10 dBm, the received voltage is less than the 18 dBm second relative reliability threshold, and a second relative reliability condition is not present.

In another relative reliability example, assume an input signal voltage measured at 21 dBm is received with the particular receiver embodiment discussed in the previous example again with a DSA attenuation setting at 0 dB. Similar to the first round of overriding the DSA setting described above, as the 21 dBm input signal voltage is above the relative reliability threshold, the relative reliability condition is detected at decision block 320. At block 322, the DSA is overridden based on the determined gain override value corresponding to a DSA setting of 9 dB and an override state indicator may be set. A corresponding gain compensation value may be determined based on the DSA override setting at block 324. As the 9 dB DSA setting is still below 11 dB, input voltage continues to be checked for relative reliability condition at decision block 320 with a second relative reliability threshold set to 18 dBm, as discussed above.

Assuming the input signal voltage continues to be measured at 21 dBm, a second relative reliability condition is detected at decision block 320 and the DSA setting is again overridden by an offset of 9 dB, the DSA setting is then set to 18 dB. As there was a change in the DSA settings, control returns, via decision block 334, to block 302. A third relative reliability threshold is calculated at 18 dBm+9 dB=27 dBm. At decision block 304, a new peak detector threshold is determined where min(18 dBm+9 dB, 20 dBm)−18 dBm=2 dB higher than the 0 dBFS voltage level at 18 dB DSA attenuation. As the DSA setting is 18 dB, which is higher than the 11 dB DSA setting, the input signal is checked for absolute reliability and a determination whether an absolute reliability condition exists is made at block 306 by comparing the input signal voltage level to the absolute reliability attenuation level threshold. Where the input signal voltage continues to be 21 dBm, an absolute reliability condition exists and at block 308, a determination is made to override the DSA setting. At state 310, the DSA setting is overridden, for example, by a maximum level setting of the DSA, or another DSA level setting based on predetermined level. In some cases, a gain compensation value may be applied, or the output of the decimation filter chain may be saturated. After the reliability condition is no longer appropriate, it may be desirable to release the DSA override.

Flowchart 300 also illustrates example techniques for releasing the DSA override. In this example, a determination to release the DSA override applied in response to an absolute reliability condition may be made at decision block 312. As an example, the determination that the DSA override should be released may be based on a determination that the input voltage level has dropped below the absolute reliability attenuation level threshold or after a some period of time has passed. In some cases, this period of time may correspond to a window length for resetting a window counter. This period of time may be indicated to the window counter. If the input voltage level has dropped, then the DSA override may be removed at block 314. If gain compensation was previously applied, or if the output of the decimation filter chain was saturated, these may also be removed at block 314.

For a relative reliability condition, there may be multiple techniques for releasing the DSA override. A first technique may be based on observations of the response of the AGC. Returning to the example discussed above with the input signal voltage measured at 10 dBm, after the DSA setting is overridden corresponding to a DSA setting of 9 dB, at block 324, a corresponding gain compensation value is determined at state 326. This gain compensation value may be used to increase the gain of a digital signal received by the AGC. In some cases, the AGC may detect an increase in the saturation of the digital signal received and increase the attenuation setting of the DSA. Returning to the example, after the gain compensation value is determined, control returns, via blocks 334, 302, and 304, to decision block 320 where input signal voltage is checked for a second relative reliability condition at decision block 320. As the second relative reliability threshold is determined to be 18 dBm, the input signal voltage is not sufficient to trigger a second relative reliability condition. At decision block 326, the override state indicator, set at block 322, may be checked. As the override state indicator is set, a difference between the DSA override setting and an updated DSA setting requested by the AGC is determined at block 328. An updated gain compensation value may also be determined based on the updated DSA setting and the DSA override setting. At decision block 330, the difference between the DSA override setting and an updated DSA setting requested by the AGC is checked to see if it is less than a decay threshold. In some cases, this decay threshold may be configurable and may include a check to ensure that the AGC has updated the DSA setting to increase attenuation. That the AGC has updated the DSA setting to increase attenuation and that the difference between the updated DSA setting and the DSA override setting is below the decay threshold indicates that the AGC has noticed and responded to address the relative reliability condition. At block 332, the DSA override may be removed (e.g., released), along with any digital gain compensation applied, and the override state indicator cleared. If the AGC has not updated the DSA and/or if the difference is above the decay threshold, then the DSA override is maintained at block 336. If necessary, the updated gain compensation value may be used to adjust the digital gain compensation.

Another technique for releasing the DSA override for a relative reliability condition may be time based. For example, a transient high-voltage input signal may trigger a relative reliability condition resulting in a DSA override. This signal may be just long enough to trigger the DSA override but not long enough to be detected by the AGC. Thus, there may be a configurable maximum time duration for the relative reliability condition, after which the DSA override may be removed. This maximum time duration may be configured to be relatively long and sufficient for the AGC to have multiple opportunities to detect and react. A check to ensure that a DSA override time duration is less than the maximum time duration (e.g., decay threshold) may be performed at block 330, for example by a reliability detector. If the DSA override time duration is greater than the maximum time duration, then the DSA override is released and the DSA override time duration is reset. If another high-voltage input signal is received, another DSA override may be imposed.

In some cases, a receiver may include more than a single peak detector. For example, circuit 200 in FIG. 2A may include multiple RF peak detectors 202A and 202B. Where multiple peak detectors are available, one of the peak detectors may be configured to detect an absolute reliability condition and another peak detector may be used to detect a relative reliability condition. In such cases, the determination whether a reliability condition and/or absolute reliability condition exists may be performed in a manner similar to that described above. Releasing the DSA override with multiple peak detectors may be similar to that described above for embodiments with a single peak detector. In some cases, with multiple peak detectors, a first peak detector may be configured to detect both absolute and relative reliability conditions and a second peak detector may be configured to detect an input voltage level based on the threshold for the peak detector. In such cases, when an override condition is present, the second peak detector may be used to determine whether the input voltage level has fallen below the threshold and thus the override condition is no longer present and release the DSA override.

Figure 4:
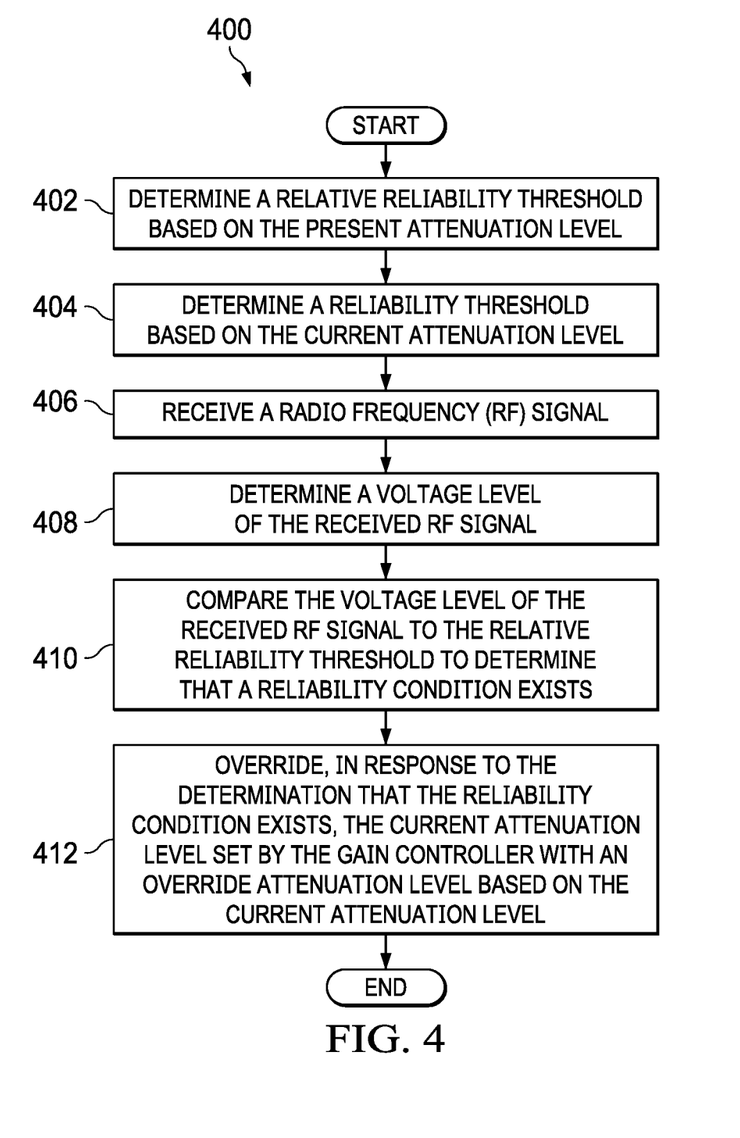
FIG. 4 is a flow diagram illustrating a technique for receiver reliability handling, in accordance with aspects of the present disclosure.

FIG. 4 is a flow diagram 400 illustrating a technique for receiver reliability handling, in accordance with aspects of the present disclosure. At block 402, a present attenuation level for an attenuator is determined. The attenuator level indicates an amount of attenuation to be applied to a received RF signal and may be determined by the AGC in conjunction with a gain controller, such as gain controller module 222, and a reliability detector, such as reliability detector 210. At block 404, a reliability threshold is determined based on the present attenuation level. For example, a relative reliability threshold may be determined, for example by a reliability detector, such as reliability detector 210, based on the present attenuation level set by the gain controller. In some cases, this relative reliability threshold may be based on an offset from the attenuation level and a full-scale signal. At block 406, a radio frequency (RF) signal is received. For example, one or more peak detectors, such as peak detector 202A and/or peak detector 202B, may receive an analog signal from one or more antennas. In some cases, the signal received by the peak detectors may have been modified, such as amplified, by one or more LNAs. In some cases, root mean square (RMS) power voltage may also be used.

At block 408 a voltage level of the received RF signal is determined. For example, one or more of the peak detectors may measure a signal voltage level of the received RF signal. At block 410 the voltage level of the received RF signal is compared to the reliability threshold to determine that a reliability condition exists. For example, if the voltage level is equal or above a reliability threshold power level, then a relative reliability condition exists. In some cases, this comparison may be performed by a reliability detector, such a reliability detector 210. At block 410, in response to the determination that the reliability condition exists, overriding the present attenuation level set by the gain controller with an override attenuation level based on the present attenuation level. For example, the DSA attenuation setting may be overridden, by a gain controller such as gain controller 222, with a predetermined value, where the predetermined value is based on present DSA setting.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A receiver comprising:
an RF peak detector coupled to a reliability detector wherein the RF peak detector is configured to:
receive a radio frequency (RF) signal; and
determine a voltage level of the received RF signal;
wherein the reliability detector module is configured to determine a relative reliability threshold based on a present attenuation level;
an override value module coupled to the reliability detector module configured to:
compare the voltage level of the received RF signal to the relative reliability threshold to determine that a reliability condition exists; and
override, in response to the determination that the reliability condition exists, the present attenuation level set by a gain controller with an override attenuation level based on the present attenuation level; and
a gain compensation value module coupled to the override value module wherein the gain compensation value module is configured to set the present attenuation level for an attenuator.

2. The receiver of claim 1, wherein the override value module is further configured to update the relative reliability threshold based on the override attenuation level.

3. The receiver of claim 1, wherein the attenuator is coupled to a RF analog to digital converter (RF-ADC) and wherein the receiver includes one or more gain compensation modules configured to apply a gain compensation to an output signal of the RF-ADC.

4. The receiver of claim 3, wherein an amount of gain compensation is based on the override attenuation level and present attenuation level.

5. The receiver of claim 4, wherein the override value module is further configured to:
receive an updated attenuation level from the gain controller; and
determine to release the override based on at least one of:
a maximum time duration;
an indication from a peak detector; or
a comparison between the updated attenuation level, the override attenuation level, and a decay threshold.

6. The receiver of claim 4, wherein the override value module is further configured to:
receive an updated attenuation level from the gain controller;
determine not to release the override based on a comparison between the updated attenuation level and a decay threshold; and
update the gain compensation based on the updated attenuation level.

7. The receiver of claim 3, wherein the receiver further comprises a gain compensation module coupled to a peak detector wherein the gain compensation module is configured to apply a gain compensation to an output from the peak detector.

8. The receiver of claim 1, wherein the override value module is further configured to:
determine to apply an absolute reliability threshold based on a comparison between an absolute reliability threshold and the relative reliability threshold for the present attenuation level; and
wherein the reliability detector is configured to compare the voltage level of the received RF signal to the absolute reliability threshold to determine that an absolute reliability condition exists; and wherein the override value module is further configured to override, in response to the determination that the absolute reliability condition exists, based on an absolute reliability attenuation level.

9. An electronic device comprising:
one or more processors;
a memory;
an RF peak detector coupled to a reliability detector wherein the RF peak detector is configured to:
receive a radio frequency (RF) signal; and
determine a voltage level of the received RF signal;
wherein the reliability detector module is configured to determine a relative reliability threshold based on a present attenuation level;
an override value module coupled to the reliability detector module configured to:
compare the voltage level of the received RF signal to the relative reliability threshold to determine that a reliability condition exists; and
override, in response to the determination that the reliability condition exists, the present attenuation level set by a gain controller with an override attenuation level based on the present attenuation level; and
a gain compensation value module coupled to the override value module configured to set the present attenuation level for an attenuator.

10. The electronic device of claim 9, wherein the override value module is further configured to update the relative reliability threshold based on the override attenuation level.

11. The electronic device of claim 9, wherein the attenuator is coupled to a RF analog to digital converter (RF-ADC) and wherein a receiver includes one or more gain compensation modules configured to apply a gain compensation to an output signal of the RF-ADC.

12. The electronic device of claim 11, wherein an amount of gain compensation is based on the override attenuation level and present attenuation level.

13. The electronic device of claim 12, wherein the override value module is further configured to:
receive an updated attenuation level from the gain controller;
determine not to release the override based on a comparison between the updated attenuation level and a decay threshold; and
update the gain compensation based on the updated attenuation level.

14. The electronic device of claim 11, wherein the override value module is further configured to:
receive an updated attenuation level from the gain controller; and
determine to release the override based on at least one of:
a maximum time duration;
an indication from a peak detector; or
a comparison between the updated attenuation level, the override attenuation level, and a decay threshold.

15. The electronic device of claim 11, wherein the receiver further comprises a gain compensation module coupled to a peak detector wherein the gain compensation module is configured to apply a gain compensation to an output from the peak detector.

16. The receiver of claim 9, wherein the override value module is further configured to:
  determine to apply an absolute reliability threshold based on a comparison between an absolute reliability threshold and the relative reliability threshold for the present attenuation level; and
  wherein the reliability detector is configured to compare the voltage level of the received RF signal to the absolute reliability threshold to determine that an absolute reliability condition exists; and wherein the override value module is further configured to override, in response to the determination that the absolute reliability condition exists, based on an absolute reliability attenuation level.

* * * * *